United States Patent
Yoo et al.

(10) Patent No.: US 12,424,417 B2
(45) Date of Patent: Sep. 23, 2025

(54) SUBSTRATE PROCESSING APPARATUS AND SUBSTRATE PROCESSING METHOD

(71) Applicant: PSK INC., Hwaseong-si (KR)

(72) Inventors: Kwang Sung Yoo, Hwaseong-si (KR); Tae Hwan Youn, Hwaseong-si (KR); Geon Jong Kim, Hwaseong-si (KR)

(73) Assignee: PSK INC., Hwaseong-si (KR)

( * ) Notice: Subject to any disclaimer, the term of this patent is extended or adjusted under 35 U.S.C. 154(b) by 0 days.

(21) Appl. No.: 18/026,619

(22) PCT Filed: Dec. 2, 2021

(86) PCT No.: PCT/KR2021/018054
§ 371 (c)(1),
(2) Date: Mar. 16, 2023

(87) PCT Pub. No.: WO2023/080325
PCT Pub. Date: May 11, 2023

(65) Prior Publication Data
US 2025/0079133 A1    Mar. 6, 2025

(30) Foreign Application Priority Data
Nov. 2, 2021 (KR) .......... 10-2021-0149135

(51) Int. Cl.
*H01J 37/32* (2006.01)

(52) U.S. Cl.
CPC .. *H01J 37/32568* (2013.01); *H01J 37/32091* (2013.01); *H01J 37/32449* (2013.01); *H01J 37/32642* (2013.01); *H01J 2237/334* (2013.01)

(58) Field of Classification Search
CPC .......... H01J 37/32091; H01J 37/32449; H01J 37/32568; H01J 37/32642;
(Continued)

(56) References Cited

U.S. PATENT DOCUMENTS 8,485,128 B2    7/2013    Kellogg et al.
9,564,308 B2    2/2017    Sexton et al.
(Continued)

FOREIGN PATENT DOCUMENTS

JP    2008-084693 A    4/2008
JP    2015-162558 A    9/2015
(Continued)

OTHER PUBLICATIONS

International Search Report of PCT/KR2021/018054 dated Feb. 3, 2023 [PCT/ISA/210].
(Continued)

*Primary Examiner* — Jimmy T Vu
(74) *Attorney, Agent, or Firm* — Sughrue Mion, PLLC (57) ABSTRACT

The present disclosure provides an apparatus for treating a substrate. The apparatus includes a chuck supporting the substrate, a gas supply unit configured to supply a process gas to an edge region of the substrate, and an edge electrode provided to surround the substrate supported by the chuck when viewed from a top and configured to generate plasma from the gas, in which the edge electrode has a ring shape and a groove recessed from an inner circumference of the edge electrode to an outer circumference of the edge electrode when viewed from the top is formed in the edge electrode.

19 Claims, 8 Drawing Sheets

(58) Field of Classification Search
CPC ............. H01J 2237/334; H01L 21/687; H01L 21/68735; H01L 21/68785
See application file for complete search history.

(56) References Cited

U.S. PATENT DOCUMENTS

| | | | |
|---|---|---|---|
| 10,264,630 | B2 | 4/2019 | Yoshida et al. |
| 10,658,222 | B2 | 5/2020 | Yan et al. |
| 11,201,037 | B2 * | 12/2021 | Sarode Vishwanath ............... H01J 37/32522 |
| 2016/0010210 | A1 | 1/2016 | Yanai |
| 2019/0333785 | A1 | 10/2019 | Tanikawa |
| 2021/0013014 | A1 | 1/2021 | Sarode Vishwanath |
| 2021/0020416 | A1 * | 1/2021 | Moriya ............. H01L 21/67259 |
| 2021/0305014 | A1 | 9/2021 | Kim et al. |
| 2022/0059324 | A1 | 2/2022 | Lee et al. |

FOREIGN PATENT DOCUMENTS

| | | |
|---|---|---|
| JP | 5837962 B1 | 12/2015 |
| KR | 10-2008-0001163 A | 1/2008 |
| KR | 10-2008-0094302 A | 10/2008 |
| KR | 10-2010-0043844 A | 4/2010 |
| KR | 10-2016-0088820 A | 7/2016 |
| KR | 10-2275757 B1 | 7/2021 |
| KR | 10-2021-0122209 A | 10/2021 |
| TW | I427725 B | 2/2014 |
| TW | I514461 B | 12/2015 |
| TW | 201946209 A | 12/2019 |
| TW | 202004985 A | 1/2020 |
| TW | 202121934 A | 6/2021 |

OTHER PUBLICATIONS

Written Opinion of PCT/KR2021/018054 dated Feb. 3, 2023 [PCT/ISA/237].
Taiwanese Office Action of No. 110149552 dated Jan. 31, 2023.
Communication dated Jul. 27, 2023 issued by the Korean Patent Office in application No. 10-2021-0149135.

* cited by examiner

SUBSTRATE PROCESSING APPARATUS AND SUBSTRATE PROCESSING METHOD

CROSS REFERENCE TO RELATED APPLICATIONS

This application is a National Stage of International Application No. PCT/KR2021/018054 filed on Dec. 2, 2021, claiming priority based on Korean Patent Application No. 10-2021-0149135 filed on Nov. 2, 2021, the disclosures of which are incorporated herein by reference in their entireties.

TECHNICAL FIELD

The present disclosure relates to an apparatus for and method of treating a substrate.

BACKGROUND ART

Plasma is an ionized gas state including ions, radicals, electrons, etc., and is generated in response to very high temperatures, strong electric fields, or radio frequency (RF) electromagnetic fields. A semiconductor device manufacturing process includes an ashing or etching process to remove a film material from a substrate by using plasma. The ashing or etching process is performed by collision or reaction of ions and radical particles contained in plasma with a film material on the substrate. A process of treating a substrate by using plasma may be performed in various manners. Among the methods of treating a substrate using plasma, a bevel etching process generates plasma in an edge region of the substrate to remove a thin film from the edge region of the substrate.

Also, to perform the bevel etching process, a size and a position of a region (a so-called process region) where plasma is generated are required to be adjusted according to treatment conditions. In general, the size and the position of the process region are adjusted by replacing a component of the bevel etching apparatus. However, such a method may not be appropriate to treat the substrate as long as a time consumed to replace the component, thereby resulting in low substrate treatment efficiency. Moreover, during treatment of the substrate according to a treatment recipe, the size and the position of the process region need to be changed, and with an existing scheme, it is impossible to change the size and the position of the process region or a range of the change is quite limited even when the change is possible.

DESCRIPTION OF EMBODIMENTS

Technical Problem

The present disclosure provides an apparatus for and method of efficiently treating a substrate.

The present disclosure also provides an apparatus for and method of treating a substrate by changing a position of plasma generated in an edge region of the substrate.

Moreover, the present disclosure provides an apparatus for and method of treating a substrate by changing a size of a region where plasma is generated.

Furthermore, the present disclosure provides an apparatus for and method of treating a substrate by providing an additional control factor for controlling the flow of plasma.

Problems to be solved by the present disclosure are not limited to the above-mentioned problems, and the problems not mentioned may be clearly understood by those of ordinary skill in the art to which the present disclosure belongs from the present specification and the accompanying drawings.

Solution to Problem

The present disclosure provides an apparatus for treating a substrate. The apparatus includes a housing including an inner space, a support unit supporting the substrate in the inner space, a gas supply unit configured to supply a gas to the inner space, a power source member configured to generate plasma by exciting the gas, and an upper edge electrode configured to generate the plasma in an edge region of the substrate supported by the support unit, in which the support unit includes a chuck supporting the substrate, a lower edge electrode facing the upper edge electrode, an insulating ring between the lower edge electrode and the chuck, and a moving member moving the lower edge electrode or the insulating ring in upward and downward directions.

According to an embodiment, the apparatus may further include a moving power source configured to transmit power for driving the moving member.

According to an embodiment, the moving member may be a piezoelectric (PZT) motor.

According to an embodiment, a top height of the insulating ring or the lower edge electrode moved in the upward direction by the moving member may be less than or equal to a top height of the chuck.

According to an embodiment, the moving member may be configured to move the insulating ring, out of the lower edge electrode and the insulating ring.

According to an embodiment, the moving member may be arranged under the insulating ring.

According to an embodiment, a width of the insulating ring viewed from a front cross-section may be less than a distance between an outer circumference of the chuck viewed from a top and an inner circumference of the lower edge electrode.

According to an embodiment, the insulating ring may be provided to be separated from the lower edge electrode and/or the chuck.

According to an embodiment, a distance between the insulating ring and the lower edge electrode may be about 0.2 mm to about 0.5 mm.

According to an embodiment, a distance between the insulating ring and the chuck may be about 0.2 mm to about 0.5 mm.

According to an embodiment, the apparatus may further include a controller configured to control the support unit, in which the controller is further configured to move at least one of the lower edge electrode or the insulating ring in the upward direction when a density of the plasma per unit area increases, and move at least one of the lower edge electrode or the insulating ring in the downward direction when the density of the plasma per unit area decreases.

According to an embodiment, the apparatus may further include a controller configured to control the support unit, in which the controller is further configured to move at least one of the lower edge electrode or the insulating ring in the upward and downward directions during treatment of the substrate supported by the support unit with the plasma.

The present disclosure also provides a method of treating a substrate by using a bevel etching apparatus including a chuck supporting the substrate, an upper edge electrode configured to generate plasma in an edge region of the substrate, a lower edge electrode facing the upper edge electrode, and an insulating ring between the chuck and the lower edge electrode. The method includes supplying a process gas to the edge region of the substrate and generating the plasma by exciting the process gas and adjusting at least one of a distance between the insulating ring and the upper edge electrode or a distance between the lower edge electrode and the upper edge electrode to adjust a density of the plasma per unit area.

According to an embodiment, the adjusting of the distance may be performed during the treatment of the substrate with the plasma.

According to an embodiment, the adjusting of the distance may be performed before treatment of the substrate with the plasma.

According to an embodiment, an inert gas may be supplied to a space between the substrate and a dielectric plate facing the substrate to suppress the process gas from entering a center region of the substrate during supply of the process gas to the edge region of the substrate.

According to an embodiment, the inert gas may be supplied to a center region of the substrate.

According to an embodiment, the insulating ring out of the insulating ring and the lower edge electrode may be moved in upward and downward directions to adjust the distance.

According to an embodiment, the insulating ring may be moved in the upward and downward directions by a moving member arranged under the insulating ring.

According to an embodiment, a size of the moving member may be changed by applying power to the moving member that is a piezoelectric motor, and the moving member having the changed size may move the insulating ring in the upward direction.

Advantageous Effects of Disclosure

According to an embodiment of the present disclosure, a substrate may be efficiently treated.

Moreover, according to an embodiment of the present disclosure, a position of plasma generated in an edge region of a substrate may be changed.

Furthermore, according to an embodiment of the present disclosure, a size of a region where plasma is generated may be changed.

In addition, according to an embodiment of the present disclosure, an additional control factor capable of controlling flow of plasma may be provided.

Effects of the present disclosure are not limited to the above-described effects, and the effects not mentioned may be clearly understood by those of ordinary skill in the art to which the present disclosure belongs from the present specification and the accompanying drawings.

MODE OF DISCLOSURE

Hereinafter, examples of the present disclosure will be described in detail with reference to the attached drawings to allow those of ordinary skill in the art to easily carry out the examples of the present disclosure. However, the present disclosure may be implemented in various different forms, and are not limited to the embodiments of the present disclosure described herein. In addition, in describing a preferred embodiment of the present disclosure in detail, when it is determined that a detailed description of a related known function or configuration may unnecessarily obscure the gist of the present disclosure, the detailed description will be omitted. Moreover, the same reference numerals are used for parts having similar functions and actions throughout the drawings.

When a portion is referred to as "includes" a component, the portion may not exclude another component but may further include another component unless stated otherwise. More specifically, it should be understood that the term "include", "have", or the like used herein is to indicate the presence of features, numbers, steps, operations, elements, parts, or a combination thereof described in the specifications, and does not preclude the presence or addition of one or more other features, numbers, steps, operations, elements, parts, or a combination thereof.

Singular forms include plural forms unless apparently indicated otherwise contextually. In addition, the shapes and sizes of components in the drawings may be exaggerated for the clearer description.

Hereinafter, an embodiment of the present disclosure will be described in detail with reference to FIGS. 1 to 8.

Figure 1:
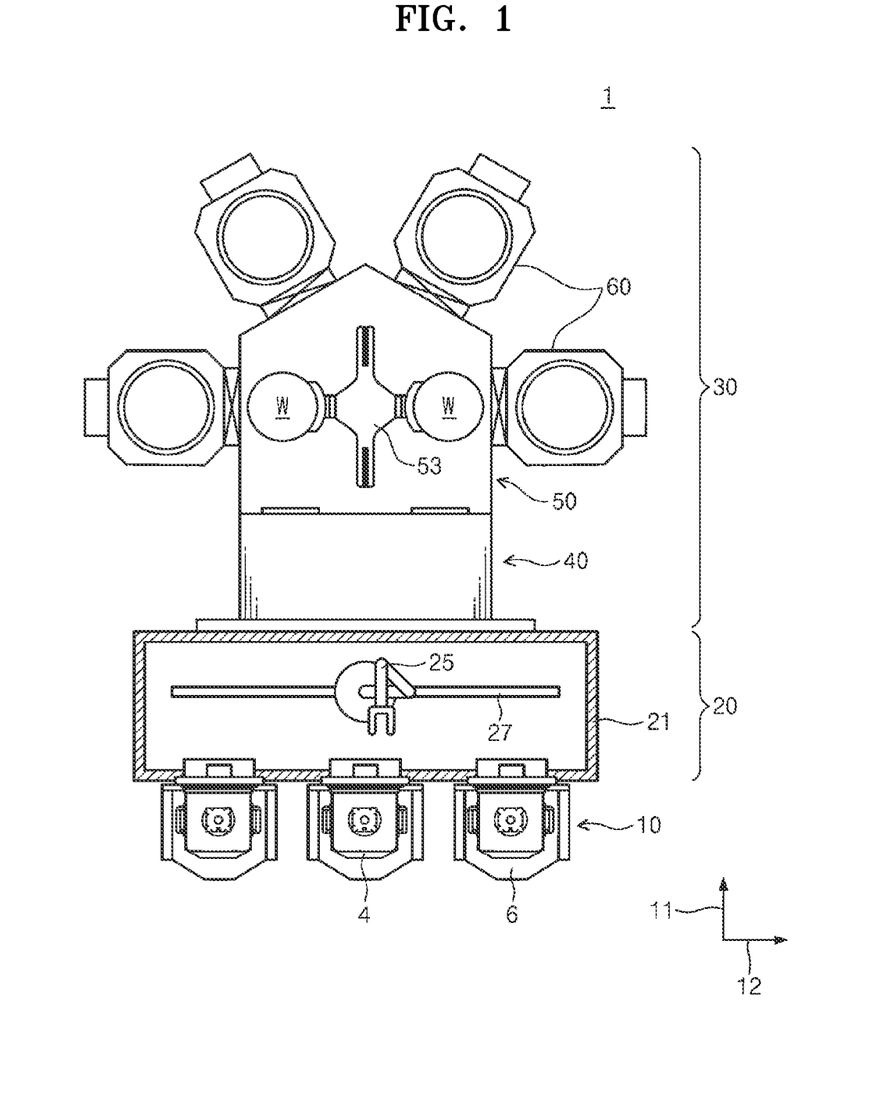
FIG. 1 schematically shows substrate treatment equipment according to an embodiment of the present disclosure.

FIG. 1 schematically shows substrate treatment equipment according to an embodiment of the present disclosure. Referring to FIG. 1, substrate treatment equipment 1 may include an equipment front end module (EFEM) 20 and a treatment module 30. The EFEM 20 and the treatment module 30 may be arranged in one direction.

The EFEM 20 may include a load port 10 and a transfer frame 21. The load port 10 may be arranged in front of the EFEM 20 in a first direction 11. The load port 10 may include a plurality of supports 6. Each support 6 may be arranged in a line in a second direction 12, and a carrier 4 (e.g., a cassette, front-opening unified pod (FOUP), etc.) having stored therein a substrate W to be provided to a process and a substrate W having been processed may be nested on the support 6. In the carrier 4, the substrate W to be provided to the process and the substrate W having been processed are stored. The transfer frame 21 may be arranged between the load port 10 and the treatment module 30. The transfer frame 21 may include a first transfer robot 25 arranged therein to transfer the substrate W between the load port 10 and the treatment module 30. The first transfer robot 25 may transfer the substrate W between the carrier 4 and the treatment module 30 by moving a transfer rail 27 provided in the second direction 12.

The treatment module 30 may include a load lock chamber 40, a transfer chamber 50, and a process chamber 60. The treatment module 30 may receive the substrate W returned from the EFEM 20 to treat the substrate W.

The load lock chamber 40 may be arranged adjacent to the transfer frame 21. For example, the load lock chamber 40 may be arranged between the transfer chamber 50 and the EFEM 20. The load lock chamber 40 may provide a space for allowing the substrate W to be provided to the process to wait before the substrate W is transferred to the process chamber 60, or allowing the substrate W having been processed to wait before the substrate W is transferred to the EFEM 20.

The transfer chamber 50 may return the substrate W. The transfer chamber 50 may be arranged adjacent to the load lock chamber 40. The transfer chamber 50 may have a polygonal body when viewed from the top. Referring to FIG. 1, the transfer chamber 50 may have a pentagonal body when viewed from the top. On the exterior of the body, the load lock chamber 40 and a plurality of process chambers 60 may be arranged along the circumference of the body. A path (not shown) through which the substrate W enters and exits may be formed on each sidewall of the body, and the path may connect the transfer chamber 50 with the load lock chamber 40 or the process chambers 60. In each path, a door (not shown) for sealing the interior by opening and closing the path may be provided. In an inner space of the transfer chamber 50, a second transfer robot 53 may be arranged to transfer the substrate W between the load lock chamber 40 and the process chambers 60. The second transfer robot 53 may transfer the non-processed substrate W waiting in the load lock chamber 40 to the process chamber 60 or transfer the processed substrate W to the load lock chamber 40. The second transfer robot 53 may carry the substrate W into or out of an inner space 102 of the housing 100 described later. The second transfer robot 53 may transfer the substrate W among the plurality of process chambers 60 to sequentially provide the substrate W to the plurality of process chambers 60. When the transfer chamber 50 has a pentagonal body as shown in FIG. 1, the load lock chamber 40 may be arranged on a sidewall adjacent to the EFEM 20 and the process chambers 60 may be consecutively arranged on the other sidewalls. The transfer chamber 50 may be provided in not only the above-described shape, but also various shapes according to a required processing module.

The process chamber 60 may be arranged adjacent to the transfer chamber 50. The process chamber 60 may be arranged along the circumference of the transfer chamber 50. The process chamber 60 may be provided in plural. In each process chamber 60, processing with respect to the substrate W may be performed. The process chamber 60 may receive the substrate W from the second transporting robot 53 to process the substrate W, and provide the processed substrate W to the second transfer robot 53. Processing performed in the respective process chambers 60 may be different.

Hereinbelow, an apparatus 1000 for treating a substrate to perform plasma processing in the process chamber 60 will be described in detail. Moreover, it will be described below as an example that the apparatus 1000 for treating a substrate is configured to perform plasma treatment processing with respect to an edge region of the substrate in the processing chamber 60. However, without being limited to the example, the apparatus 1000 for treating a substrate described below may be equally or similarly applied to various chambers where treatment on the substrate is performed. Moreover, the apparatus 1000 for treating a substrate may be equally or similarly applied to various chambers where plasma treatment processing on the substrate is performed.

Figure 2:
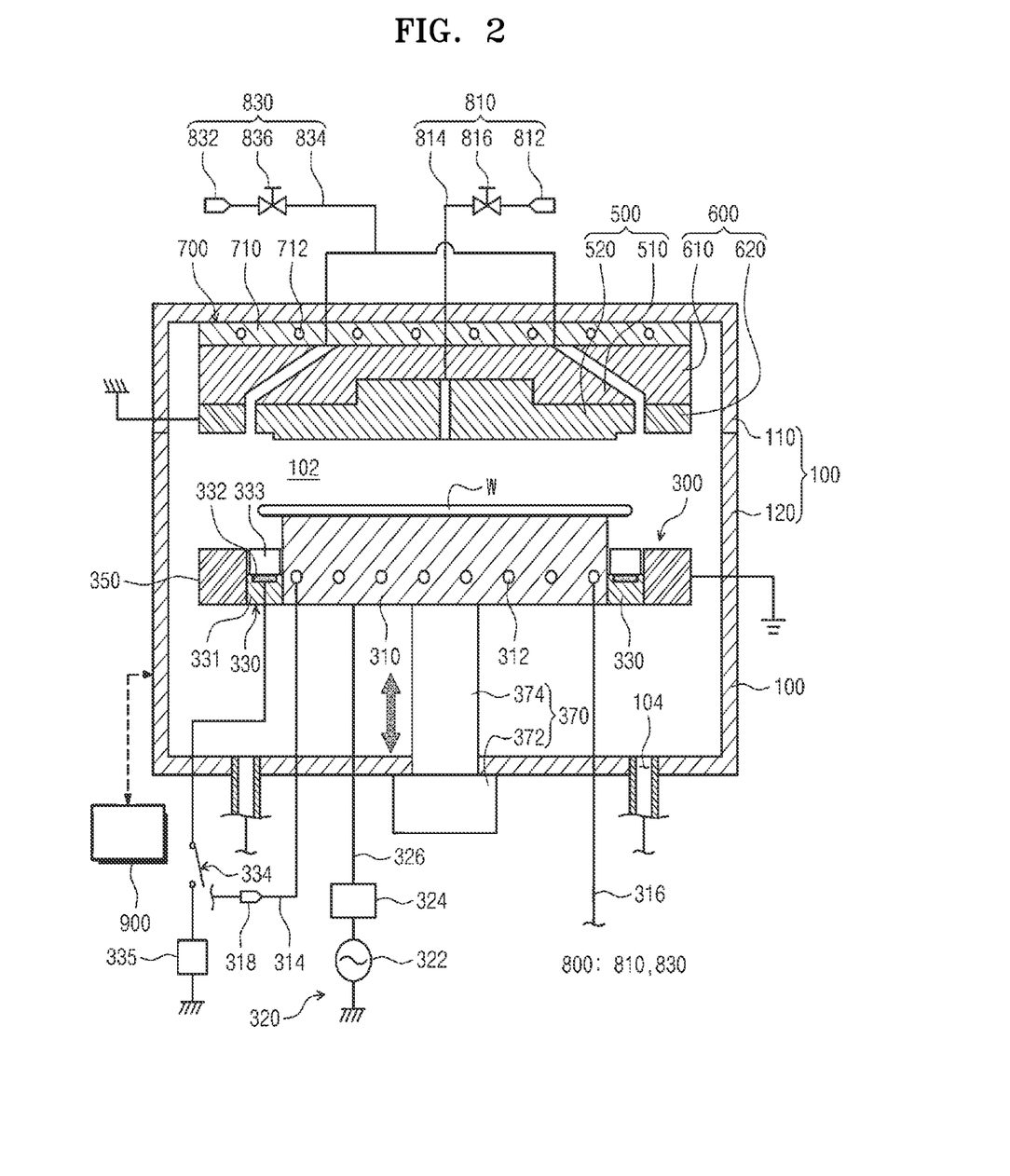
FIG. 2 is a cross-sectional view of an example of an apparatus, provided in a process chamber of FIG. 1, for treating a substrate.

FIG. 2 illustrates an example of an apparatus for treating a substrate, provided in a process chamber of FIG. 1. Referring to FIG. 2, the apparatus 1000 for treating a substrate, provided in the process chamber 60, may perform processing on the substrate W by using plasma. For example, the apparatus 1000 for treating a substrate may etch or ash a film material. The film material may include various types of film materials such as a polysilicon film, a silicon oxide film, a silicon nitride film, etc. The film material may also be a natural oxide film or a chemically generated oxide film. In addition, the film material may be a by-product generated during treatment of the substrate W. The film material may be impurities attached to and/or remaining on the substrate W.

The apparatus 1000 for treating a substrate may perform plasma processing on the substrate W. For example, the apparatus 1000 for treating a substrate may supply a process gas and generate plasma from the supplied process gas to treat the substrate W. The apparatus 1000 for treating a substrate may supply the process gas and generate plasma from the supplied process gas to treat the edge region of the substrate W. Hereinafter, a description will be made using an example where the apparatus 1000 for treating a substrate is a bevel etching apparatus that performs etching for the edge region of the substrate W.

The apparatus 1000 for treating a substrate may include a housing 100, a support unit 300, a dielectric plate unit 500, an upper electrode unit 600, a temperature control unit 700, a gas supply unit 800, and a controller 900.

The housing 100 may define the inner space 102. The housing 100 may include an upper housing (an example of a first housing) 110 and a lower housing (an example of a second housing) 120. The upper housing 110 and the lower housing 120 may be combined with each other to define the inner space 102. The upper housing 110 may be rotatably engaged with the lower housing 120 by a rotation coupling portion (not shown). For example, the upper housing 110 and the lower housing 120 may be engaged by a rotation coupling portion that may be a hinge apparatus.

The upper housing 110 may be in an open position or a closed position. Hereinbelow, the position of the upper housing 110 that defines the inner space 102 by a combination of the upper housing 110 with the lower housing 120 will be referred to as the closed position, and the position of the upper housing 110 that exposes the inner space 102 to an outside will be defined as the open position.

Moreover, the atmosphere of the inner space 102 may be isolated from the outside when the upper housing 110 is in the closed position, and the inner space 102 isolated from the outside may be adjusted to a low-pressure state (a vacuum pressure atmosphere) close to a vacuum during treatment of the substrate W. Moreover, the housing 100 may be provided as a material including metal. In addition, an inner surface of the housing 100 may be coated with an insulating material. Moreover, the housing 100 may be grounded.

The housing 100 may be a vacuum chamber. For example, an exhaust hole 104 may be formed in a bottom surface of the housing 100. Plasma P generated in the inner space 102 or gases G1 and G2 supplied to the inner space 102 may be exhausted to the outside through the exhaust hole 104. Moreover, by-products generated in a process of treating the substrate W by using the plasma P may be exhausted to the outside through the exhaust hole 104. The exhaust hole 104 may be connected to an exhaust line (not shown). The exhaust line may be connected to a decompression member providing decompression. The decompression member may provide decompression to the inner space 102 through the exhaust line.

The support unit 300 may support the substrate W in the inner space 102. The support unit 300 may include a chuck 310, a power source member 320, an insulating ring module 330, a lower electrode 350, and a driving member 370.

The chuck 310 may support the substrate W in the inner space 102. The chuck 310 may have a support surface supporting the substrate W. The chuck 310 may have a circular shape when viewed from the top. The chuck 310 may have a diameter less than the substrate W when viewed from the top. Thus, the center region of the substrate W supported by the chuck 310 may be nested on the support surface of the chuck 310, and the edge region of the substrate W may not meet the support surface of the chuck 310.

A heating means (not shown) may be provided inside the chuck 310. The heating means (not shown) may heat the chuck 310. Heating means may be a heater. In addition, a cooling flow path 312 may be formed in the chuck 310. The cooling flow path 312 may be formed inside the chuck 310. A cooling fluid supply line 314 and a cooling fluid discharge line 316 may be connected to the cooling flow path 312. The cooling fluid supply line 314 may be connected to a cooling fluid supply source 318. The cooling fluid supply source 318 may store cooling fluid and/or the cooling fluid to the cooling fluid supply line 314. In addition, the cooling fluid supplied to the cooling flow path 312 may be discharged outside through the cooling fluid discharge line 316. Cooling fluid stored and/or supplied by the cooling fluid supply source 318 may be cooling water or cooling gas. The shape of the cooling flow path 312 formed in the chuck 310 may be variously changed without being limited to the shape shown in FIG. 2. A structure for cooling the chuck 310 may be various structures (e.g., a cooling plate, etc.) capable of cooling the chuck 310 without being limited to a structure for supplying cooling fluid.

The power source member 320 may apply power to the chuck 310 and excite a gas supplied by the gas supply unit 800 described below to generate plasma. The power source member 320 may apply a radio frequency (RF) power to the chuck 310. The power source member 320 may include a power source 322, a matcher 324, and a power line 326. The power source 322 may be a bias power source. The power source 322 may be an RF power source. The power source 322 may be connected to the chuck 310 through the power source line 326. The matcher 324 may be provided to the power source line 326 to perform impedance matching.

The insulating ring module 330 may change a volume of a process region. The process region may be a region which is defined by the insulating ring 333, the lower edge electrode 350, an upper edge electrode 620, and a dielectric plate 520 and in which the plasma P for treating the edge region of the substrate W is generated and remains there. The insulating ring module 330 may include a ring body 331, a moving member 332, the insulating ring 333, a moving switch 334, and a moving power source 335.

Figure 3:
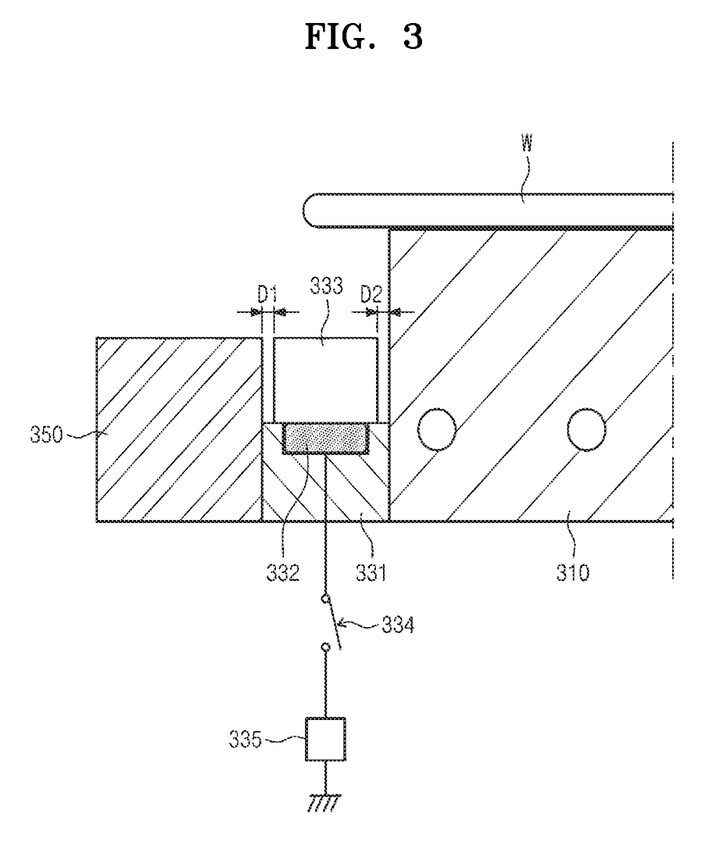
FIG. 3 is a cross-sectional view of a part of a chuck, a lower edge electrode, and an insulating ring module of FIG. 2.
Figure 4:
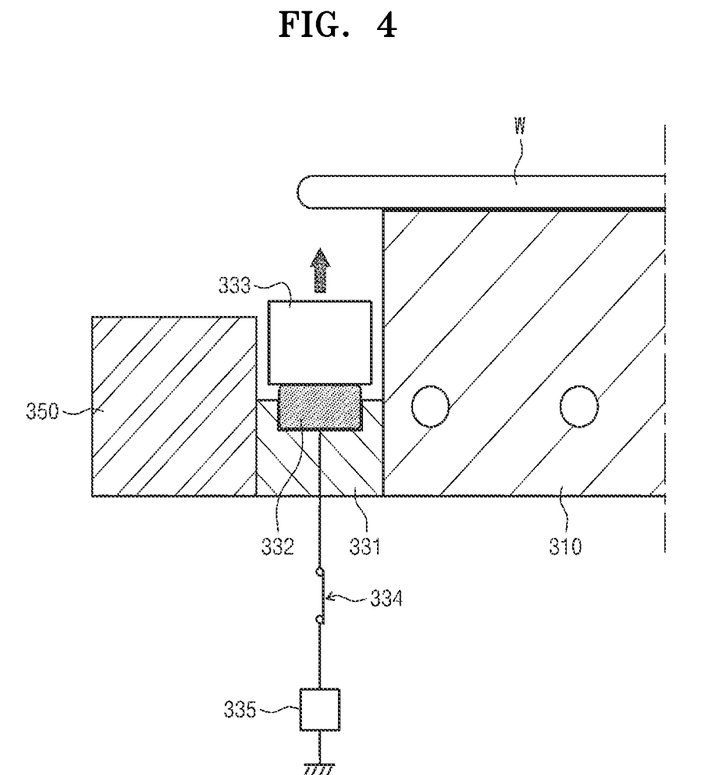
FIG. 4 shows an insulating ring of FIG. 3 that moves in an upward direction.

FIG. 3 is a cross-sectional view showing a part of the chuck, the lower edge electrode, and the insulating ring module of FIG. 2, and FIG. 4 shows a state where the insulating ring of FIG. 3 moves in an upward direction.

Referring to FIGS. 3 and 4, the ring body 331 may have a ring shape. The ring body 331 may be arranged between the chuck 310 and the lower edge electrode 350 when viewed from a top. The ring body 331 may be coupled with the chuck 310 and the lower edge electrode 350 when viewed from the top. The ring body 331 may be provided as a material having an insulating property. A seating groove may be formed in an upper portion of the ring body 331 in such a way to be recessed in a direction from top to bottom. The seating groove may be formed in plural. The seating grooves may be formed separated from one another in a circumferential direction of the ring body 331 when viewed from the top. The moving member 332 described below may be disposed in the seating grooves.

The moving member 332 may move the insulating ring 333 in upward and downward directions. The moving member 332 may move the insulating ring 333 in the upward and downward directions to adjust a distance between the insulating ring 333 and the upper edge electrode 620. The distance between the insulating ring 333 and the upper edge electrode 620 may mean a distance between a virtual straight line parallel to the top surface of the insulating ring 333 and a virtual straight line parallel to the bottom surface of the upper edge electrode 620.

The moving member 332 may be a piezoelectric (PZT) motor. The moving member 332 may receive power from the moving power source 335 according to on/off of the moving switch 334. The moving power source 335 may be a direct current power source. When the moving member 332 receives power from the moving power source 335, the size of the moving member 332 may be changed. For example, when the moving member 332 receives power from the moving power source 335, the size of the moving member 332 may be increased. The moving member 332 may be under the insulating ring 333. The insulating ring 333 may be moved in the upward and downward directions according to a change in the size of the moving member 332. The moving switch 334 may be turned on/off in response to a control signal received from a controller 900 described below.

The insulating ring 333 may be provided on the moving member 332. The insulating ring 333 may be provided as an insulating material. The insulating ring 333 may have a ring shape when viewed from the top. In addition, a left-right width of the insulating ring 333 viewed from a front cross-section may be less than a distance between an inner circumference of the lower edge electrode 350 and an outer circumference of the chuck 310.

The insulating ring 333 may be provided to be separated from the lower edge electrode 350 and/or the chuck 310. For example, the insulating ring 333 may be separated from the lower edge electrode 350 by a first distance D1. The insulating ring 333 may be separated from the chuck 310 by a second distance D2. The first distance D1 and the second distance D2 may be distances making the plasma P generated in the process region difficult to penetrate. For example, the first distance D1 may be about 0.2 mm to about 0.5 mm. The second distance D2 may also be about 0.2 mm to about 0.5 mm.

Referring back to FIG. 2, the lower edge electrode 350 may surround the insulating ring 333 when viewed from the top. The lower electrode 350 may have a ring shape when viewed from the top. The lower edge electrode 350 may be grounded. The lower edge electrode 350 may be arranged under the edge region of the substrate W supported by the chuck 310, when viewed from the top. A lower portion of the edge region of the substrate W may be a region overlapping or not overlapping the edge region of the substrate W, when viewed from the top.

The driving member 370 may lift the chuck 310. The driving member 370 may include a driver 372 and a shaft 374. The shaft 374 may be coupled with the chuck 310. The shaft 374 may be connected with the driver 372. The driver 372 may lift the chuck 310 in an up-down direction through the shaft 374. As the driving member 370 lifts or lowers the chuck 310, a distance between the top surface of the substrate W supported by the chuck 310 and the bottom surface of the dielectric plate 520 may be adjusted.

The dielectric plate unit 500 may include a dielectric plate 520 and a first base 510. The dielectric plate unit 500 may be coupled with a temperature control plate 710 described later.

The dielectric plate 520 may be arranged such that a bottom surface thereof faces the top surface of the chuck 310. The dielectric plate 520 may have a circular shape when viewed from the top. The top surface of the dielectric plate 520 may be stepped such that a height of a center region thereof is greater than a height of an edge region thereof. The bottom surface of the dielectric plate 520 may be provided in a flat shape. The bottom surface of the dielectric plate 520 may be stepped such that a height of the edge region thereof is greater than a height of the center region thereof. The plasma P described below may enter the stepped region of the bottom surface of the dielectric plate 520, thereby improving the efficiency of treatment with respect to the edge region of the substrate W.

The dielectric plate 520 may be arranged to face the top surface of the substrate W supported by the support unit 300, more specifically, the chuck 310, in the inner space 102. The dielectric plate 520 may be arranged on the support unit 300. The dielectric plate 520 may be provided as a material including ceramic. In the dielectric plate 520, a gas flow path connected to a first gas supply unit 810 of the gas supply unit 800 described below may be formed. In addition, a discharge end of the gas flow path may be structured such that the first gas G1 supplied by the first gas supply unit 810 may be supplied to the center region of the substrate W supported by the support unit 300. The discharge end of the gas flow path may also be structured such that the first gas G1 is supplied to the top surface of the center region of the substrate W supported by the support unit 300.

The first base 510 may be arranged between the dielectric plate 520 and the temperature control plate 710 described later. The first base 510 may be coupled with the temperature control plate 710 described below, and the dielectric plate 520 may be coupled with the first base 510. Thus, the dielectric plate 520 may be coupled with the temperature control plate 710 through the first base 510.

A diameter of the first base 510 may gradually increase in a direction from top to bottom. The top surface of the first base 510 may have a less diameter than the bottom surface of the dielectric plate 520. The top surface of the first base 510 may have a flat shape. The bottom surface of the first base 510 may have a stepped shape. For example, the bottom surface of the edge region of the first base 510 may be stepped such that the height of the bottom surface of the edge region is less than the height of the bottom surface of the center region of the first base 510. The bottom surface of the first base 510 and the top surface of the dielectric plate 520 may have shapes combinable with each other. For example, the center region of the dielectric plate 520 may be inserted into the center region of the first base 510. The first base 510 may be provided as a material including metal. For example, the first base 510 may be provided as a material including aluminum. The position of the dielectric plate 520 may be fixed by the first base 510.

The upper electrode unit 600 may include a second base 610 and an upper electrode 620. In addition, the upper electrode unit 600 may be coupled with the temperature control plate 710 described below. The upper edge electrode 620 may be grounded. The upper edge electrode 620 may have a shape surrounding the dielectric plate 520, when viewed from the top. The upper edge electrode 620 may be provided to be separated from the dielectric plate 520. The upper edge electrode 620 may be separated from the dielectric plate 520 to form a separating space. The separating space may form a part of a gas channel in which the second gas G2 supplied by the second gas supply unit 830 described below flows. The discharge end of the gas channel may be structured such that the second gas G2 may be supplied to the edge region of the substrate W supported by the support unit 300. The discharge end of the gas channel may also be structured such that the second gas G2 may be supplied to the top surface of the edge region of the substrate W supported by the support unit 300.

The upper edge electrode 620 may be formed to surround the dielectric plate 520, when viewed from the top. The upper electrode 620 may have a ring shape when viewed from the top. The upper edge electrode 620 may be grounded. The upper edge electrode 620 may be arranged on the edge region of the substrate W supported by the chuck 310, when viewed from the top. An upper portion of the edge region of the substrate W may be a region overlapping or not overlapping the edge region of the substrate W, when viewed from the top.

The second base 610 may be installed above the chuck 310 and the substrate W supported by the chuck 310. The second base 610 may fix the position of the upper edge electrode 620. The second base 610 may be arranged between the upper edge electrode 620 and the temperature control plate 710 described later. The second base 610 may be coupled with the temperature control plate 710 described below, and the upper edge electrode 620 may be coupled with the second base 610. Thus, the upper edge electrode 620 may be coupled with the temperature control plate 710 through the second base 610.

The second base 610 may have a ring shape, when viewed from the top. The top surface and the bottom surface of the second base 610 may have a flat shape. When viewed from the top, the second base 610 may have a shape surrounding the first base 510. An inner diameter of the second base 610 may gradually increase in the direction from top to bottom. The second base 610 may be provided to be separated from the first base 510. The second base 610 may be separated from the first base 510 to form a separating space. The separating space may form a part of a gas channel in which the second gas G2 supplied by the second gas supply unit 830 described below flows. In an example, the second base 610 may be provided as a material including metal. For example, the second base 610 may be provided as a material including aluminum.

The temperature control unit 700 may include the temperature control plate 710 and a fluid supply module (not shown).

The temperature control plate 710 may be coupled with the dielectric plate unit 500 and the upper electrode unit 600. The temperature control plate 710 may be installed on a ceiling of the upper housing 110. The temperature control plate 710 may be arranged in the inner space 102 when the upper housing 110 is in the closed position that defines the inner space 102. The temperature control plate 710 may prevent the temperatures of the first base 510 and the second base 610 from excessively increasing. For example, in the temperature control plate 710, a flow path 712 through which a cooling fluid supplied by the fluid supply module flows may be formed. The cooling fluid may be a cooling water. On the other hand, the cooling fluid may be a cooling gas.

According to an embodiment of the present disclosure, the first base 510 may be arranged between the dielectric plate 520 and the temperature control plate 710. The first base 510 may be provided as a material that is different from the dielectric plate 520 and a material that is the same as the temperature control plate 710. That is, a coefficient of thermal expansion of the first base 510 may be closer to a coefficient of thermal expansion of the temperature control plate 710 than that of the dielectric plate 520. That is, as the first base 510 is arranged between the dielectric plate 510 and the temperature control plate 710, it is possible to minimize distortion between the temperature control plate 710 and the dielectric plate 520 due to a cooling heat, etc., generated by the temperature control plate 710. This is because the first base 510 directly contacting the temperature control plate 710 is provided as a material similar to the temperature control plate 710.

Likewise, according to an embodiment of the present disclosure, the second base 610 may be arranged between the upper edge electrode 620 and the temperature control plate 710. The second base 610 may be provided as a material that is different from the upper edge electrode 620 and a material that is the same as the temperature control plate 710. That is, a coefficient of thermal expansion of the second base 610 may be closer to a coefficient of thermal expansion of the temperature control plate 710 than that of the upper edge electrode 620. That is, as the second base 610 is arranged between the upper edge electrode 620 and the temperature control plate 710, it is possible to minimize distortion between the temperature control plate 710 and the upper edge electrode 620 due to a cooling heat, etc., generated by the temperature control plate 710. This is because the second base 610 directly contacting the temperature control plate 710 is provided as a material similar to the temperature control plate 710.

The gas supply unit 800 may supply a gas to the inner space 102. The gas supply unit 800 may supply the first gas G1 and the second gas G2 to the inner space 102. The gas supply unit 800 may include a first gas supply unit 810 and a second gas supply unit 830.

The first gas supply unit 810 may supply the first gas G1 to the inner space 102. The first gas G1 may be an inert gas such as nitrogen, etc. The first gas supply unit 810 may supply the first gas G1 to the center region of the substrate W supported by the chuck 310. The first gas supply unit 810 may include a first gas supply source 812, a first gas supply line 814, and a first valve 816. The first gas supply source 812 may store the first gas G1 and/or supply the first gas G1 to the first gas supply line 814. The first gas supply line 814 may be connected with a flow path formed on the dielectric plate 520. The first valve 816 may be installed in the first gas supply line 814. The first valve 816 may be an on/off valve or a flow control valve. The first gas G1 supplied by the first gas supply source 812 may be supplied to the center region of the top surface of the substrate W through the flow path formed on the dielectric plate 520.

The second gas supply unit 830 may supply the second gas G2 to the inner space 102. The second gas G2 may be a process gas that is excited to a plasma state. The second gas supply unit 830 may supply the second gas G2 to the edge region of the substrate W through a gas channel formed by separation between the dielectric plate 520, the first base 510, the upper edge electrode 620, and the second base 610, provided on the edge region of the substrate W supported by the chuck 310. The second gas supply unit 830 may include a second gas supply source 832, a second gas supply line 834, and a second valve 836. The second gas supply source 832 may store the second gas G2 and/or supply the second gas G2 to the second gas supply line 834. The second gas supply line 814 may supply the second gas G2 to a separating space functioning as a gas channel. The second valve 836 may be installed in the second gas supply line 834. The second valve 836 may be an on/off valve or a flow control valve. The second gas G2 supplied by the second gas supply source 832 may be supplied to the edge region of the top surface of the substrate W through the second flow path 602.

The controller 900 may control the apparatus 1000 for treating a substrate. The controller 900 may control the apparatus 1000 for treating a substrate to perform plasma treatment processing process performed as below. For example, the controller 900 may control the gas supply unit 800, the temperature control plate 710, and the support unit 300. For example, the controller 900 may control the support unit 300 and the gas supply unit 800 to generate the plasma P in the edge region of the substrate W supported by the chuck 310 by application of the power to the chuck 310 from the power source 322 when the first gas supply unit 810 and/or the second gas supply unit 830 supplies gas.

The controller 900 may control the apparatus 1000 for treating a substrate to perform a method of treating a substrate described below. The controller 900 may also include a process controller including a microprocessor (a computer) that performs control with respect to the apparatus 1000 for treating a substrate, a user interface including a keyboard that performs command input manipulation, etc., for an operator to manage the apparatus 1000 for treating a substrate, a display that displays an operation state of the apparatus 1000 for treating a substrate by visualizing the operation state, etc., and a storage unit that stores a control program for performing processing performed by the apparatus 1000 for treating a substrate with control by the process controller or a program for executing processing of each component according to various data and processing conditions, i.e., a processing recipe. Moreover, the user interface and the storage unit may be connected to the process controller. The processing recipe may be stored in a storage medium of the storage unit, and the storage medium may be a hard disk, a portable disk such as a compact disc read only memory (CD-ROM), a digital versatile disc (DVD), etc., or a semiconductor memory such as a flash memory, etc.

Figure 5:
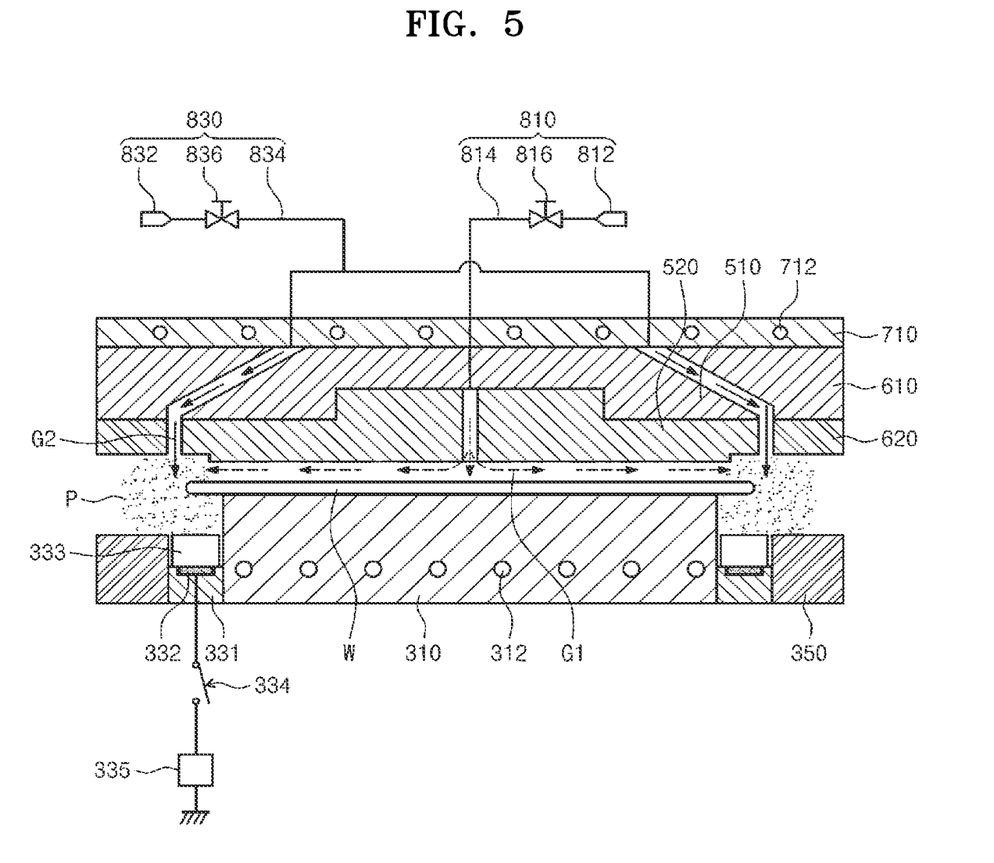
FIG. 5 shows a state of an apparatus for treating a substrate, which uses a method of treating a substrate, according to an embodiment of the present disclosure.

FIG. 5 shows a state of an apparatus for treating a substrate, which performs a method of treating a substrate, according to an embodiment of the present disclosure.

Referring to FIG. 5, the apparatus 1000 for treating a substrate according to an embodiment of the present disclosure may treat the edge region of the substrate W. For example, the apparatus 1000 for treating a substrate may generate the plasma P in the edge region of the substrate W to treat the edge region of the substrate W. For example, the apparatus 1000 for treating a substrate may perform a bevel etching process that treats the edge region of the substrate W.

To perform the bevel etching process with respect to the substrate W, the driving member 370 may move the chuck 310 in the upward direction to narrow a distance between the substrate W and the dielectric plate 520.

When the apparatus 1000 for treating a substrate treats the edge region of the substrate W, the first gas supply unit 810 may supply the first gas G1 to the center region of the substrate W and the second gas supply unit 830 may supply the second gas G2 to the edge region of the substrate W. The second gas G2 supplied by the second gas supply unit 830 is a processing gas, and thus may be excited to a plasma P state to treat the edge region of the substrate W. For example, a thin film on the edge region of the substrate W may be etched by the plasma P. The first gas G1 supplied to the center region of the substrate W may be an inert gas, and the first gas G1 may suppress the second gas G2 from entering the center region of the substrate W to further improve the efficiency of treatment with respect to the edge region of the substrate W.

Figure 6:
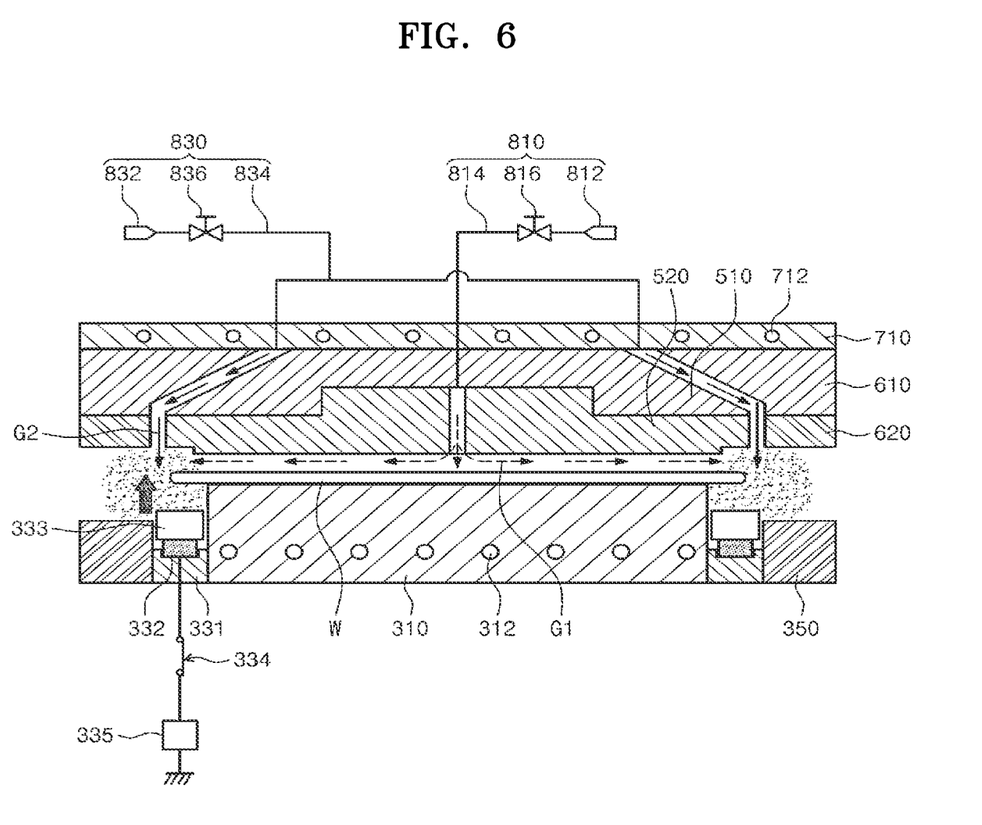
FIG. 6 shows a state of changing a volume of a process region during treatment of the substrate of FIG. 5 with plasma.

FIG. 6 shows a state of changing a volume of a process region during treatment of the substrate of FIG. 5 with plasma.

The controller 900 may generate a control signal for controlling the support unit 300. The controller 900 may control the support unit 300 to change a volume of a process region. For example, the controller 900 may turn on the moving switch 334 to cause the power of the moving power source 335 to be applied to the moving member 332. In this case, the moving member 332 that is a PTZ motor may move the insulating ring 333 in the upward direction.

When the insulating ring 333 is moved in the upward direction, a distance between the insulating ring 333 and the upper edge electrode 620 may decrease. Herein, the distance may refer to the shortest distance between a virtual straight line parallel the top surface of the insulating ring 333 and a virtual straight line parallel to the bottom surface of the upper edge electrode 620. When the insulating ring 333 is moved in the upward direction, the volume of the process region may decrease. Thus, a space in which the second gas G2 flows may decrease. Assuming that a supply flow amount per unit time of the second gas G2 supplied and a magnitude of an RF power applied to the chuck 310 are constant, the density per unit area of the plasma P flowing in the process region may further increase. In addition, as the magnitude of the RF power transmitted per unit area increases, the intensity of the generated plasma P may increase.

On the other hand, when the insulating ring 333 is moved in the downward direction, the distance between the insulating ring 333 and the upper edge electrode 620 may increase. When the insulating ring 333 is moved in the downward direction, the volume of the process region may increase. Thus, a space in which the second gas G2 flows may increase. Assuming that a supply flow amount per unit time of the second gas G2 supplied and a magnitude of an RF power applied to the chuck 310 are constant, the density per unit area of the plasma P flowing in the process region may further decrease. In addition, as the magnitude of the RF power transmitted per unit area decreases, the intensity of the generated plasma P may decrease. That is, the present disclosure may provide a new plasma control factor for allowing adjustment of a flow of the plasma P, size and position of the process region, the density of the plasma P by changing the position of the insulating ring 333.

Moreover, in the present disclosure, movement of the insulating ring 333 in the upward and downward directions may be made during treatment of the edge region of the substrate W by the plasma P. For example, when one substrate W is treated, a first treating operation of treating the substrate W with the volume of the process region as a first volume and a second treating operation of treating the substrate W with a second volume, which is different from the first volume, as the volume of the process region. According to treatment conditions with respect to the substrate W, the intensity of the plasma P needs to be changed during treatment, but the present disclosure may adjust the intensity of the plasma P by moving the insulating ring 333 during a process of treating the substrate W.

Figure 7:
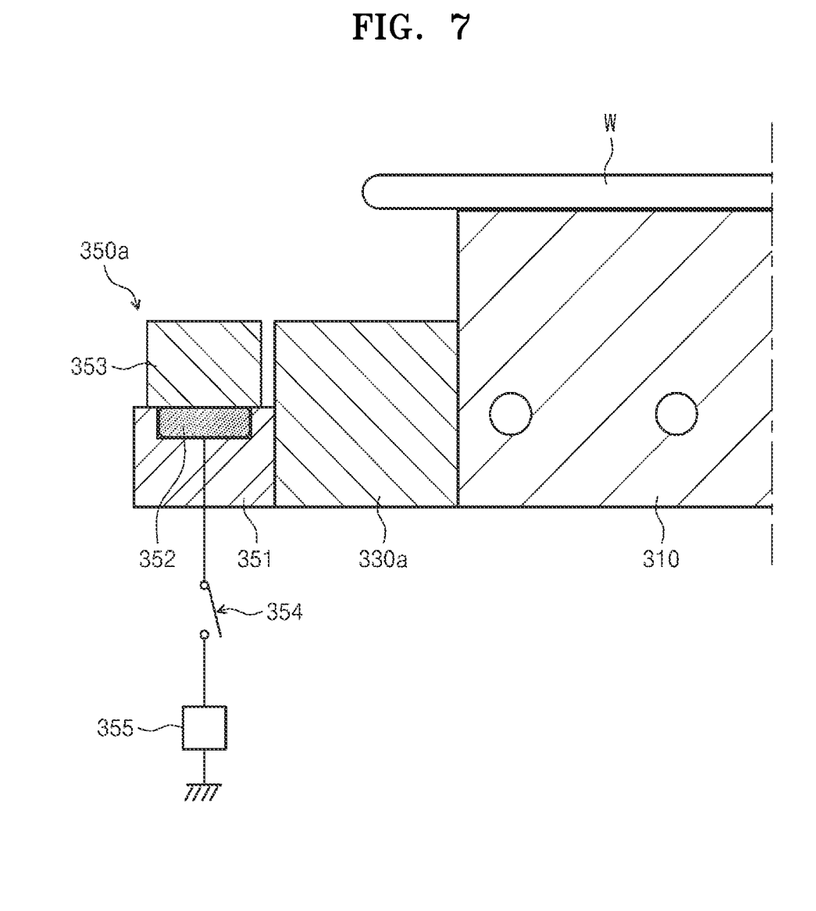
FIG. 7 shows a state of a support unit according to another embodiment of the present disclosure.
Figure 8:
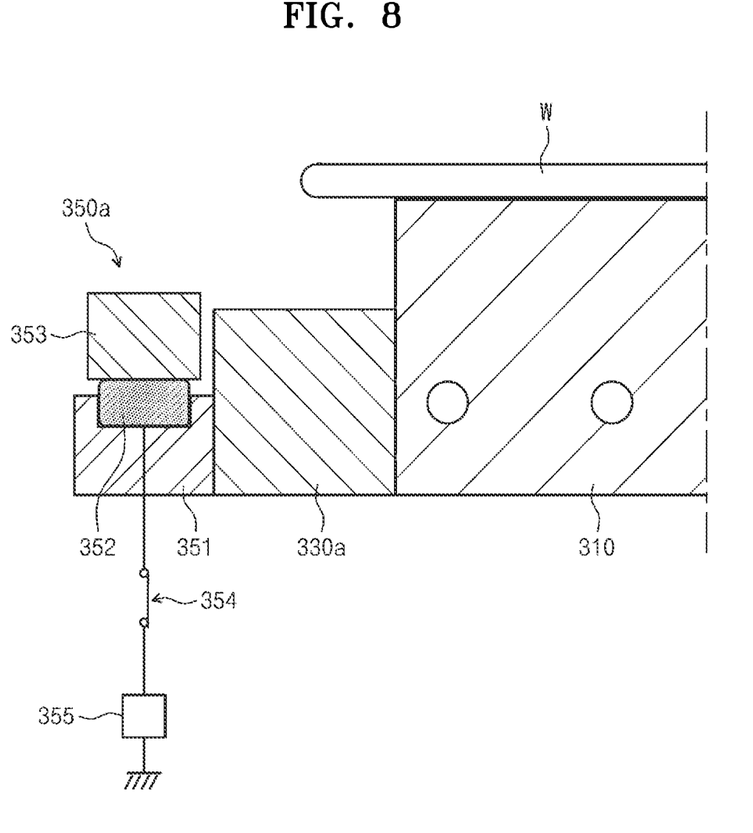
FIG. 8 shows a state where a position of a lower edge electrode of FIG. 7 is changed.

Although a component moving in the upward and downward directions is the insulating ring 333 in the foregoing example, the present disclosure is not limited thereto. For example, as shown in FIGS. 7 and 8, the component for adjusting the volume of the process region by moving in the upward and downward directions may be a lower edge electrode.

The support unit 300 according to another embodiment may include an insulating ring 330*a* and a lower edge electrode module 350*a*. The lower edge electrode module 350*a* may include a ring body 351, a moving member 352, a lower edge electrode 353, a moving switch 354, and a moving power source 355. The lower edge electrode 353 may be separated from the insulating ring 330*a* by about 0.2 mm to about 0.5 mm. A mechanism where the lower edge electrode 353 moves in the upward/downward directions may be the same as/or similar to a mechanism where the insulating ring 333 of the insulating ring module 330 described above moves in the upward/downward directions, and thus will not be described repeatedly.

Moreover, in the above-described example, a component for adjusting the volume of the process region by moving in the upward and downward directions is any one of the lower edge electrode 353 and the insulating ring 333, but the component for adjusting the volume of the process region may include the lower edge electrode 353 and the insulating ring 333.

In the above-described example, the distance between the insulating ring 333 and the upper edge electrode 620 is adjusted during treatment of the substrate W by the plasma P to adjust the density of the plasma P per unit area, but such distance adjustment may be performed before the substrate W is treated by the plasma P.

In the foregoing example, the chuck 310 moves in the upward and downward directions and the positions of the dielectric plate 520 and the upper edge electrode 620 are fixed, the present disclosure is not limited thereto. For example, the position of the chuck 310 may be fixed and the dielectric plate 520 may be movable in the upward and downward directions. Moreover, both the chuck 310 and the dielectric plate 520 may be movable in the upward and downward directions.

While the upper edge electrode 620 and the lower edge electrode 340 are grounded in the foregoing example, the present disclosure is not limited thereto. For example, the upper edge electrode 620 and/or the lower edge electrode 350 may be connected to an RF power source.

A method of generating the plasma P by the apparatus 1000 for treating the substrate described in the foregoing example may be an inductive coupled plasma (ICP) scheme. The above-described method of generating the plasma P by the apparatus for treating the substrate may be a capacitor couple plasma (CCP) scheme. The apparatus for treating the substrate may generate the plasma P by using both the ICP scheme and the CCP scheme or a scheme selected from the ICP scheme and the CCP scheme. The apparatus 1000 for treating a substrate may also generate the plasma P by using a remote plasma scheme.

The above detailed description exemplifies the present disclosure. In addition, the foregoing description is provided by showing a preferred embodiment of the present disclosure, and the present disclosure may be used in various combinations, changes and environments. That is, it is possible to change or modify within the scope of the concept of the present disclosure disclosed herein and the equivalent range to the foregoing disclosure and/or the range of the technique or knowledge of the art. The above-described embodiment describes the best state for implementing the technical idea of the present disclosure, and may also make various changes required in the specific application field and use of the present disclosure. Therefore, the detailed description of the present disclosure is not intended to limit the present disclosure to the disclosed embodiment. In addition, the accompanying claims should be interpreted as including other embodiments.

The invention claimed is:

1. An apparatus for treating a substrate, the apparatus comprising:
   a housing comprising an inner space;
   a support unit supporting the substrate in the inner space;
   a gas supply unit configured to supply a gas to the inner space;
   a power source member configured to generate plasma by exciting the gas; and
   an upper edge electrode configured to generate the plasma in an edge region of the substrate supported by the support unit,
   wherein the support unit comprises:
      a chuck supporting the substrate;
      a lower edge electrode facing the upper edge electrode;
      an insulating ring arranged between the lower edge electrode and the chuck; and
      a moving member configured to move at least one of the lower edge electrode or the insulating ring in upward and downward directions between an up position and a down position,
   wherein, based on the at least one of the lower edge electrode or the insulating ring being in the up position, the inner space has a first volume,
   wherein, based on the at least one of the lower edge electrode or the insulating ring being in the down position, the inner space has a second volume, and
   wherein the second volume is greater than the first volume.

2. The apparatus of claim 1, further comprising a moving power source configured to transmit power for driving the moving member.

3. The apparatus of claim 2, wherein the moving member is a piezoelectric (PZT) motor.

4. The apparatus of claim 2, wherein the insulating ring or the lower edge electrode moved in the upward direction by the moving member is less than or equal to a top height of the chuck.

5. The apparatus of claim 1, wherein the moving member is configured to move the insulating ring out of the lower edge electrode.

6. The apparatus of claim 5, wherein the moving member is arranged under the insulating ring.

7. The apparatus of claim 5, wherein the insulating ring is provided to be separated from at least one of the lower edge electrode or the chuck.

8. The apparatus of claim 7, wherein a distance between the insulating ring and the lower edge electrode is about 0.2 mm to about 0.5 mm.

9. The apparatus of claim 7, wherein a distance between the insulating ring and the chuck is about 0.2 mm to about 0.5 mm.

10. The apparatus of claim 1, further comprising a controller configured to control the support unit,
   wherein the controller is further configured to:
      move at least one of the lower edge electrode or the insulating ring in the upward direction when a density of the plasma per unit area increases; and
      move at least one of the lower edge electrode or the insulating ring in the downward direction when the density of the plasma per unit area decreases.

11. The apparatus of claim 1, further comprising a controller configured to control the support unit,
   wherein the controller is further configured to
      move at least one of the lower edge electrode or the insulating ring in the upward and downward directions during treatment of the substrate supported by the support unit with the plasma.

12. A method of treating a substrate by using a bevel etching apparatus comprising a chuck supporting the substrate, an upper edge electrode configured to generate plasma in an edge region of the substrate, a lower edge electrode facing the upper edge electrode, and an insulating ring between the chuck and the lower edge electrode, the method comprising:
   supplying a process gas to the edge region of the substrate and generating the plasma by exciting the process gas;
   generating a control signal for controlling a position of at least of the lower edge electrode or the insulating ring between an up position and a down position, an inner space of the bevel etching apparatus having a first volume based on the at least one of the lower edge electrode or the insulating ring being in the up position, the inner space having a second volume based on the at least one of the lower edge electrode or the insulating ring being in the down position, and the second volume being greater than the first volume; and
   adjusting at least one of a distance between the insulating ring and the upper edge electrode or a distance between the lower edge electrode and the upper edge electrode to adjust a density of the plasma per unit area.

13. The method of claim 12, wherein the adjusting of the distance is performed during treatment of the substrate with the plasma.

14. The method of claim 12, wherein the adjusting of the distance is performed before treatment of the substrate with the plasma.

15. The method of claim 14, wherein an inert gas is supplied to a space between the substrate and a dielectric plate facing the substrate to suppress the process gas from entering a center region of the substrate during supply of the process gas to the edge region of the substrate.

16. The method of claim 15, wherein the inert gas is supplied to the center region of the substrate.

17. The method of claim 15, wherein the insulating ring is moved in upward and downward directions to adjust the distance.

18. The method of claim 17, wherein the insulating ring is moved in the upward and downward directions by a moving member arranged under the insulating ring.

19. The method of claim 18, wherein a size of the moving member is changed by applying power to the moving member that is a piezoelectric motor, and the moving member having the changed size moves the insulating ring in the upward direction.

* * * * *